(12) United States Patent
Qin et al.

(10) Patent No.: US 12,021,085 B2
(45) Date of Patent: Jun. 25, 2024

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Lijun Qin, Wuhan (CN); Peng Hu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 84 days.

(21) Appl. No.: 17/286,480

(22) PCT Filed: Mar. 22, 2021

(86) PCT No.: PCT/CN2021/082021
§ 371 (c)(1),
(2) Date: Apr. 18, 2021

(87) PCT Pub. No.: WO2022/170662
PCT Pub. Date: Aug. 18, 2022

(65) Prior Publication Data
US 2023/0307460 A1 Sep. 28, 2023

(30) Foreign Application Priority Data
Feb. 10, 2021 (CN) .......................... 202110185036.1

(51) Int. Cl.
*H01L 27/12* (2006.01)

(52) U.S. Cl.
CPC ...... *H01L 27/1218* (2013.01); *H01L 27/1262* (2013.01)

(58) Field of Classification Search
CPC ............ H01L 27/1218; H01L 27/1262; H01L 27/1244; G02F 1/1333; G02F 1/136286; Y02E 10/549; H10K 59/131
See application file for complete search history.

(56) References Cited

U.S. PATENT DOCUMENTS

2016/0066409 A1* 3/2016 Kwon .................. H01L 27/124
174/254
2018/0175323 A1 6/2018 Ahn et al.
(Continued)

FOREIGN PATENT DOCUMENTS

| CN | 108417608 A | 8/2018 |
| CN | 109285461 A | 1/2019 |

(Continued)

OTHER PUBLICATIONS

International Search Report in International application No. PCT/CN2021/082021, dated Nov. 15, 2021.
(Continued)

*Primary Examiner* — Mamadou L Diallo
(74) *Attorney, Agent, or Firm* — PV IP PC; Wei Te Chung; Zhigang Ma

(57) ABSTRACT

A display panel and a manufacturing method thereof are provided. The display panel includes a non-display area which is provided with a bending area. The bending area includes a substrate layer, a metal wiring layer, and a first planarization layer sequentially disposed. A groove is defined on a surface of the substrate layer away from the metal wiring layer, where a groove wall of the groove extends along a curved surface or a flat surface to a groove bottom of the groove to let an orthographic projection of the groove bottom of the groove on the substrate layer fall (Continued)

within an orthographic projection of an opening of the groove on the substrate layer, so that the metal wiring layer is located in a neutral layer or close to the neutral layer.

20 Claims, 8 Drawing Sheets

(56) References Cited

U.S. PATENT DOCUMENTS

| | | | |
|---|---|---|---|
| 2020/0013330 A1* | 1/2020 | Kim | H10K 71/621 |
| 2021/0005675 A1* | 1/2021 | Li | G06F 1/1626 |
| 2022/0255025 A1* | 8/2022 | Yang | H10K 77/111 |
| 2022/0310752 A1* | 9/2022 | Liu | H10K 59/131 |

FOREIGN PATENT DOCUMENTS

| | | | |
|---|---|---|---|
| CN | 109585514 A | | 4/2019 |
| CN | 109659318 A | | 4/2019 |
| CN | 109786426 A | * | 5/2019 |
| CN | 109786426 A | | 5/2019 |
| CN | 110062077 A | | 7/2019 |
| CN | 110428731 A | | 11/2019 |
| CN | 110517590 A | | 11/2019 |
| CN | 110544431 A | | 12/2019 |
| CN | 110827684 A | | 2/2020 |
| CN | 111225088 A | | 6/2020 |
| CN | 211403923 U | | 9/2020 |
| CN | 112086024 A | | 12/2020 |
| KR | 20180073742 A | | 7/2018 |

OTHER PUBLICATIONS

Written Opinion of the International Search Authority in International application No. PCT/CN2021/082021, dated Nov. 15, 2021.
Chinese Office Action issued in corresponding Chinese Patent Application No. 202110185036.1 dated Jun. 17, 2022, pp. 1-8.

* cited by examiner

DISPLAY PANEL AND MANUFACTURING METHOD THEREOF

RELATED APPLICATIONS

This application is a Notional Phase of PCT Patent Application No. PCT/CN2021/082021 having international filing date of Mar. 22, 2021, which claims the benefit of priority of Chinese Patent Application Nos. 202110185036.1 filed on Feb. 10, 2021. The contents of the above applications are all incorporated by reference as if fully set forth herein in their entirety.

FIELD OF INVENTION

The application relates to a technical field, in particular to a display panel and a manufacturing method thereof.

BACKGROUND OF INVENTION

With rapid advancement in display technology, display panels are gradually advancing towards a trend of lightness and thinness, high screen-to-body ratio, narrow bezel, and even no bezel. In particular, for small-sized display panels such as display panels that are applied to mobile phones, this advancement trend is particularly obvious. A lower frame of a display panel usually needs to accommodate various circuit components, such as a source drive circuit, a timing control circuit, a touch control circuit, and a detection circuit, etc., and it needs to be bound with a flexible printed circuit board (FPC). Due to limitation of wiring arrangements of the FPC and the circuit components, advancement of narrow-frame display panels is restricted.

TECHNICAL PROBLEM

Taking a mobile phone as an example, the display panel of the mobile phone usually includes a display area and a non-display area located at a bottom of the display area. The non-display area is provided with a bending area and a bonding area. The bonding area is provided with a driver chip integrating multiple circuit functions and pads for bonding with the FPC. In order to achieve a narrow bezel design, the prior art adopts a pad bending (PB) process to bend the bonding area to a backside of the display area through the bending area. It can be understood that the smaller the bending radius of the bending area, the narrower the width of the lower frame of the display panel. However, the bending area usually includes a metal wiring layer. The smaller the bending radius of the bending area, the greater the bending stress on the metal wiring layer, and the greater the risk of metal wiring breakage. Therefore, the reduction range of the bending radius of the bending area in the prior art is limited, which limits the reduction of the width of the lower frame of the display panel.

SUMMARY OF INVENTION

In view of the shortcomings of the prior art, the main purpose of the present application is to provide a display panel and a manufacturing method thereof, which can effectively improve the bending yield of the display panel bending area and ensure a better bending effect.

In a first aspect, the present application provides a display panel. The display panel includes a display area and a non-display area located at a side of the display area, wherein the non-display area includes a bending area and a bonding area, the bending area is configured to be located between the display area and the bonding area, and the bending area includes: a substrate layer; a metal wiring layer disposed on the substrate layer; and a first planarization layer disposed on the metal wiring layer; wherein a groove is defined on a surface of the substrate layer away from the metal wiring layer, a groove wall of the groove extends along a curved surface or a flat surface to a groove bottom of the groove, and an orthographic projection of the groove bottom of the groove on the substrate layer falls within an orthographic projection of an opening of the groove on the substrate layer.

According to the present invention, a ratio of a distance $\Delta W$ between a boundary of the orthographic projection of the opening of the groove on the substrate layer and a boundary of the orthographic projection of the groove bottom of the groove on the substrate layer to a depth D of the groove is greater than or equal to 10:1.

According to the present invention, the distance $\Delta W$ is not less than 50 microns.

According to the present invention, in a cross-section of the display panel, an angle $\theta$ between the groove wall of the groove and a horizontal direction is not greater than 6°.

According to the present invention, the groove wall of the groove and the groove bottom of the groove is transitionally connected by a rounded corner.

According to the present invention, the bending area further includes a support layer, the support layer is disposed on a side of the substrate layer away from the metal wiring layer, the support layer is provided with a cavity at a position corresponding to the groove, and an orthographic projection of an opening of the cavity on the substrate layer covers the orthographic projection of the opening of the groove on the substrate layer.

According to the present invention, a cavity wall of the cavity is an inclined plane inclined in a direction from inside of the groove to outside of the groove.

According to the present invention, a cavity wall of the cavity is a flat surface perpendicular to the groove bottom of the groove.

According to the present invention, a cavity wall of the cavity is a curved plane.

According to the present invention, the substrate layer includes a first organic layer, an inorganic layer, and a second organic layer that are stacked, the first organic layer is disposed on a side of the inorganic layer away from the metal wiring layer, and the groove is disposed on a side of the first organic layer away from the metal wiring layer.

According to the present invention, a ratio of a depth of the groove to a thickness of the first organic layer ranges from 0.4:1 to 0.5:1.

According to the present invention, the bending area includes a bending portion, and the bending portion is disposed in an area corresponding to the groove bottom of the groove.

According to the present invention, the bending area further includes a second planarization layer, and the second planarization layer is disposed between the substrate layer and the metal wiring layer.

According to the present invention, the second planarization layer includes an inorganic planarization layer and an organic planarization layer, the inorganic planarization layer is provided with a through-hole at a position corresponding to the groove, and the organic planarization layer is disposed in the through-hole.

In a second aspect, the present application provides a manufacturing method of a display panel. The manufacturing method includes following steps:

providing a substrate layer, predefining a display area and a non-display area located at a side of the display area on the substrate layer, and predefining a bending area and a bonding area in the non-display area, wherein the bending area is predefined to locate between the display area and the bonding area; forming a metal wiring layer on the substrate layer located in the bending area; forming a first planarization layer on the metal wiring layer; providing a support layer, and pre-cutting the support layer at a pre-cut position; in the bending area, attaching the support layer to a side of the substrate layer away from the metal wiring layer after pre-cutting the support layer, and then peeling off the material of the support layer at the pre-cut position to form a cavity, and a portion of the substrate layer in the bending area is exposed from the cavity; and performing a thinning treatment on the substrate layer exposed from the cavity to form a groove; wherein a groove wall of the groove extends along a curved surface or a flat surface to a groove bottom of the groove, and an orthographic projection of the groove bottom of the groove on the substrate layer falls within an orthographic projection of an opening of the groove on the substrate layer.

According to the present invention, the thinning process is performed by a laser process, wherein the wavelength of the laser ranges from 340 nanometers to 360 nanometers The present application provides a display panel and a manufacturing method thereof. The display panel includes a bending area which mainly includes a substrate layer, a metal wiring layer disposed on the substrate layer, and a first planarization layer disposed on the metal wiring layer. Wherein, a groove is defined on a surface of the substrate layer away from the metal wiring layer, a groove wall of the groove extends along a curved surface or a flat surface to a groove bottom of the groove, and an orthographic projection of the groove bottom of the groove on the substrate layer falls within an orthographic projection of an opening of the groove on the substrate layer.

In this display panel, on one hand, grooves are provided on the surface of the substrate layer away from the metal wiring layer, which effectively reduces the thickness of the substrate layer. In this way, the most stressed metal wiring layer in the film structure of the bending area is adjusted to become a neutral layer or close to a neutral layer. It can effectively release the bending stress of the metal wiring layer and greatly reduce the risk of metal wiring breakage. On the other hand, a special design is made for the shape of the groove wall, so that the stress at the groove wall changes slowly during bending, thereby reducing a risk of stress concentration and effectively improving the quality of the substrate layer after bending. In summary, by configuring grooves of the specific shape on the substrate layer, the bending yield of the bending area of the display panel can be effectively improved, and a better bending quality can be ensured.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

In order to make the objectives, features, and advantages of the present invention more comprehensible, preferred embodiments of the present invention are described below in detail with reference to the accompanying drawings. Further, the directional terms mentioned in the present invention, such as "above", "below", "front", "back", "left", "right", "inside", "outside", "side", etc., only refer to the direction of the drawings. Therefore, the directional terms are used to describe and understand the present invention, rather than to limit the present invention.

An embodiment of the present invention provides a display panel, which can be a liquid crystal display (LCD) panel, an organic light-emitting diode display (OLED) panel, or the like.

Figure 1:
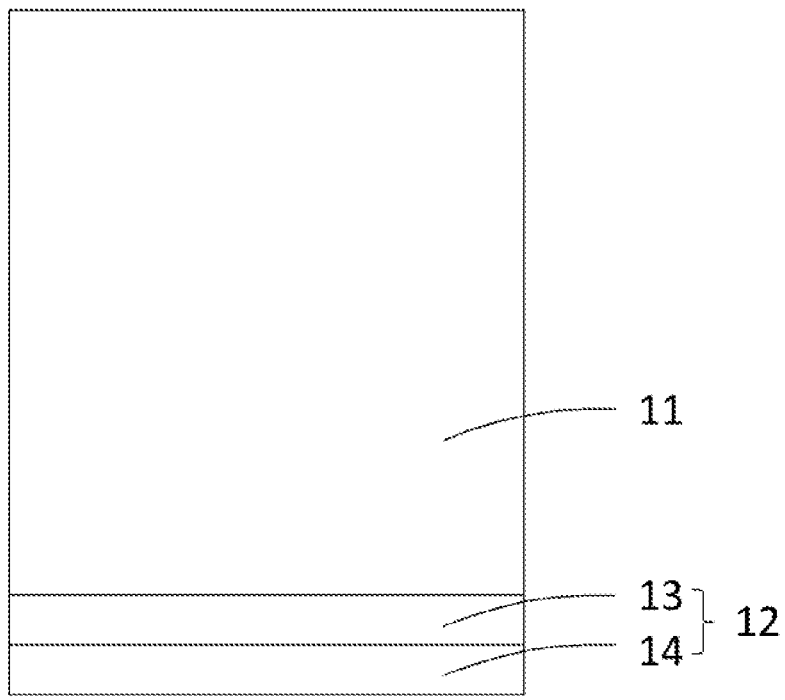
FIG. 1 is a schematic diagram of a planar structure of a display panel provided by an embodiment of the present invention.

As shown in FIG. 1, the display panel includes a display area 11 and a non-display area 12 disposed at one side of the display area 11. The non-display area 12 is provided with a bending area 13 and a bonding area 14, and the bending area 13 is configured to be located between the display area 11 and the bonding area 14. In the present application, the bending area 13 can be bent through a pad bending (PB)

process, so that the bonding area 14 is provided on the backside of the display area 11 to achieve a narrow frame design.

The bending area 13 is used to realize an arrangement of the bonding area 14 on the backside of the display area 11. The bending area 13 is arranged adjacent to the bonding area 14, and the bending area 13 is connected to the bonding area 14.

Figure 2:
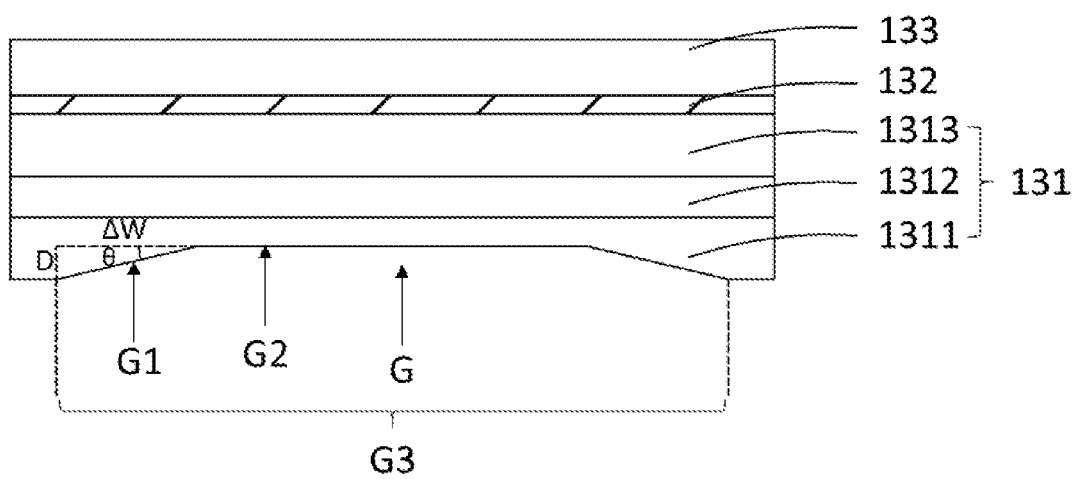
FIG. 2 is a schematic diagram of a cross-sectional structure of the display panel provided by an embodiment of the present invention.

FIG. 2 shows a schematic cross-sectional structure diagram of an embodiment of the bending area. The bending area mainly includes a substrate layer 131, a metal wiring layer 132, and a first planarization layer 133. The metal wiring layer 132 is disposed on one side of the substrate layer 131, and the first planarization layer 133 is disposed on a side of the metal wiring layer 132 away from the substrate layer 131.

A groove G is provided on a side of the substrate layer 131 away from the metal wiring layer 132 to reduce the thickness of the substrate layer 131 so that the bending stress on the metal wiring layer 12 when the bending area 13 is bent is reduced, thereby reducing the risk of metal trace fracture.

It should be noted that an outer layer of the material is stretched while an inner layer is squeezed during a bending process. There must be a transition layer that is neither stretched nor squeezed in its cross-section where the stress is almost equal to zero, and this transition layer is the aforementioned neutral layer.

In addition, in an embodiment of the present invention, reference is made to FIG. 2. A groove wall G1 of the groove G extends along a flat surface to a groove bottom G2 of the groove G, and an orthographic projection of the groove bottom G2 of the groove G on the substrate layer 131 falls within an orthographic projection of an opening G3 of the groove G on the substrate layer 131. That is, the groove wall G1 is inclined relative to a plane of the groove bottom G2. Compared with the groove wall designed to be directly perpendicular to the groove bottom G2, in this embodiment, the transition from the groove wall G1 to the groove bottom G2 is smoother. Thus, during a bending process, the stress in the groove wall G1 of the groove G is gently transitioned, which prevents the problem of poor bending caused by stress concentration in some positions.

Figure 3:
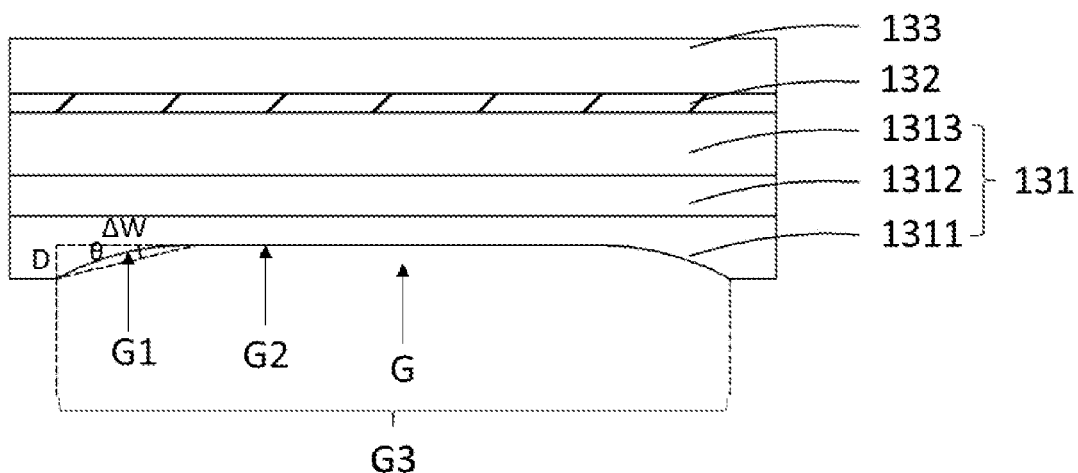
FIG. 3 is a schematic diagram of a cross-sectional structure of another display panel provided by an embodiment of the present invention.

Further, in another embodiment of the present application, another display panel is provided, the cross-sectional structure of which is shown in FIG. 3, the general structure is similar to the previous embodiment. The difference is only in the groove wall G1 of the groove G. Specifically, a groove wall G1 of the groove G extends along a curved surface to a groove bottom G2 of the groove G, and an orthographic projection of the groove bottom G2 of the groove G on the substrate layer 131 falls within an orthographic projection of an opening G3 of the groove G on the substrate layer 131. That is, the groove wall G1 is a smooth curved surface recessed into the substrate layer 131. Compared with the inclined plane of the previous embodiment, in this embodiment, the shape of the groove wall G1 changes more smoothly, so that the stress during a bending process is gently transitioned. This design more effectively prevents the problem of stress concentration in some positions, thereby improving the bending yield of the bending area of the display panel and ensuring a better bending effect.

In this embodiment, the substrate layer 131 may be a single-layer structure or a multi-layer structure.

The metal wiring layer 132 can be a single-layer structure or a multi-layer structure. The material of the metal wiring layer 132 can be gold (Au), silver (Ag), titanium (Ti), copper (Cu), nickel (Ni), platinum (Pt), palladium (Pd), aluminum (Al), molybdenum (Mo), or other single metal materials. It can also be an alloy material such as an alloy of aluminum (Al) and neodymium (Nd) or an alloy of molybdenum (MO) and tungsten (W), etc. It can also be a metal oxide with conductive properties. Generally, the metal wiring layer 132 in the bending area is formed on the same layer as the source and drain electrodes and data lines in the display area.

The first planarization layer can be a single-layer structure or a multilayer structure. The material of the first planarization layer is not specifically limited, as long as it is a planarization material commonly used in the art.

Further, the inventor has verified that the smoother the slope of the groove wall G1 of the groove G is, the more beneficial it is to uniformly and effectively absorb and release the bending stress and prevent stress concentration. Please continue to refer to FIG. 2 or FIG. 3. A distance of the orthographic projection boundary of the opening G3 on the substrate layer 131 beyond the orthographic projection boundary of the groove bottom G2 on the substrate layer 131 is defined as ΔW, and a depth of the groove G is defined as D. The ratio of ΔW to D is not less than 10:1, which is conducive to uniformly and effectively absorb and release bending stress and prevent stress concentration. The size of ΔW can be determined according to the groove depth D, and ΔW is not less than 50 microns. In addition, when the angle θ between the groove wall G1 of the groove G and the horizontal direction is not greater than 6°, the expected bending yield and bending quality can be obtained.

Figure 4:
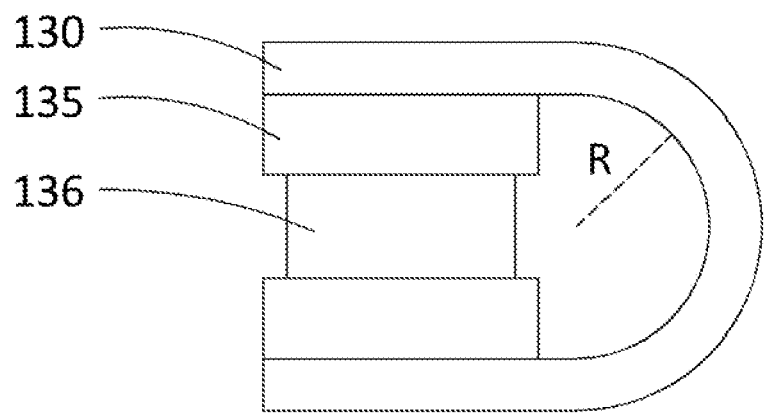
FIG. 4 is a schematic structural diagram of the display panel when it is bent according to an embodiment of the present invention.

For a specific bending example, please refer to FIG. 4. The functional structure layer 130 in the bending area of the above-mentioned display panel is bent. The functional structure layer 130 includes the aforementioned substrate layer 131, the metal wiring layer 132, and the first planarization layer 133, and the support layer 135 at both ends of the bending area is adhered thereon by an adhesive layer 136. Thus, an arc-shaped bent frame is formed on the side of the display panel. Through the structural design of this embodiment, the radius R of curvature of the bent frame can be less than 0.35 mm, which is beneficial to realize a narrow frame display.

Figure 5:
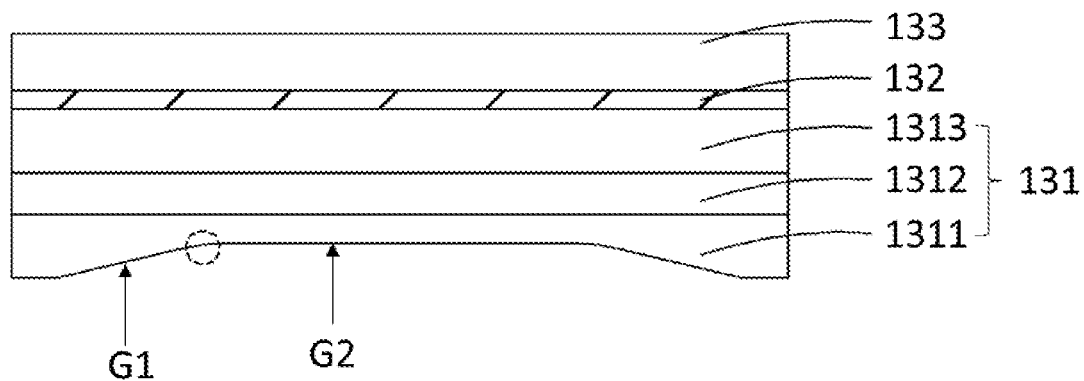
FIG. 5 is a schematic diagram of a cross-sectional structure of another display panel provided by an embodiment of the present invention.

In another embodiment of the present application, referring to the schematic cross-sectional structure in FIG. 5, in a case that the groove wall G1 is a plane inclined with respect to the groove bottom G2, the stress is likely to concentrate at the corner during bending. In order to prevent the stress concentration at the corner, in this embodiment, the groove wall G1 and the groove bottom G2 are transitioned by a rounded corner. As such, the bending stress is not easily concentrated at the corner, which is beneficial to obtain a higher bending yield and a better bending quality.

It can be understood that when the groove wall G1 of the groove G extends along a curved surface to the groove bottom G2 of the groove G, the groove wall G1 will naturally be transitionally connected to the groove bottom G2 by a rounded corner.

Figure 6:
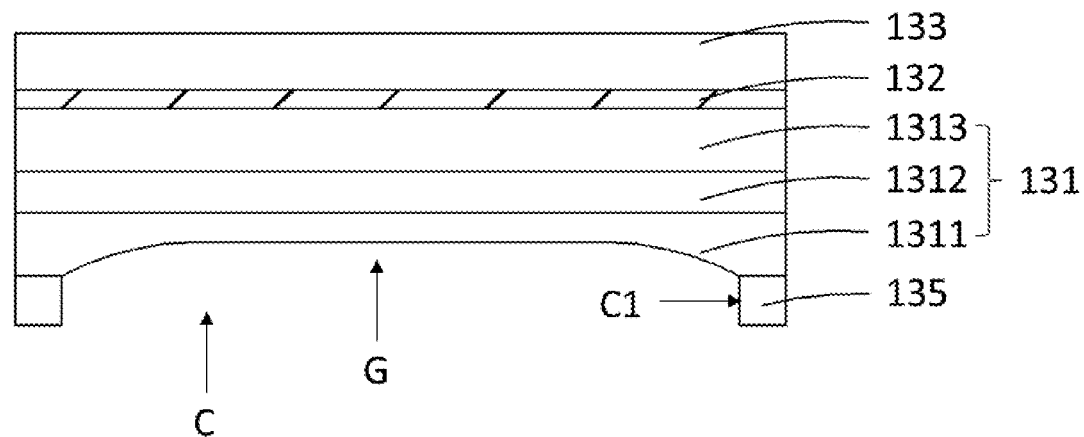
FIG. 6 is a schematic diagram of a cross-sectional structure of another display panel provided by an embodiment of the present invention.

In another embodiment of the present application, referring to the schematic cross-sectional structure of FIG. 6, the bending area further includes a support layer 135, which is provided on the side of the substrate layer 131 away from the metal wiring layer 132. The support layer 135 can be a single-layer structure or a multi-layer structure including at least a rigid structure. The material of the rigid structure can be metal, such as copper, so as to provide support for the display panel. In addition, the support layer 135 is provided with a cavity C at a position corresponding to the groove G, and an orthographic projection of an opening of the cavity C on the substrate layer 131 covers the orthographic projection of the opening G3 of the groove G on the substrate layer 131.

Figure 7:
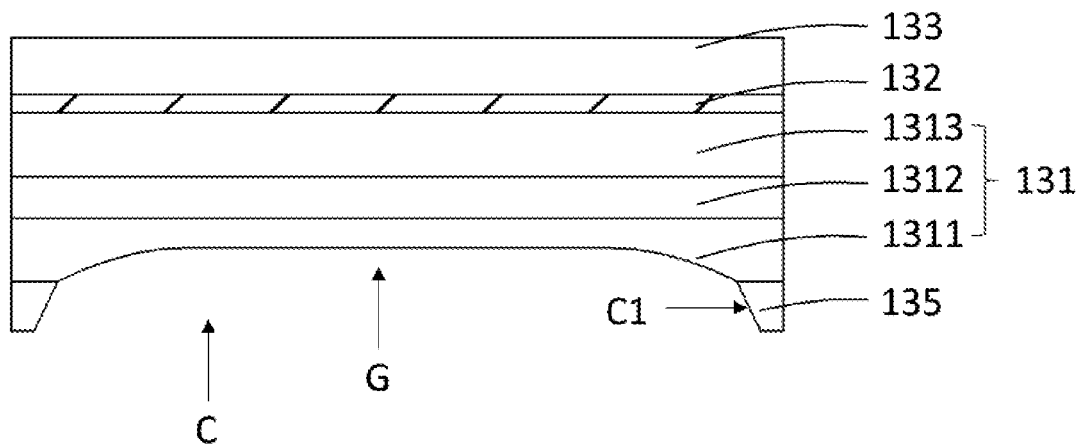
FIG. 7 is a schematic diagram of a cross-sectional structure of another display panel provided by an embodiment of the present invention.

Further, the cavity wall C1 of the cavity C may be a flat surface perpendicular to the bottom of the groove G. That is, as shown in FIG. 7, the cavity wall C1 of the cavity C can also be an inclined plane inclined from the inside to the outside of the groove G. That is, as shown in FIG. 7, it has been verified that when the cavity wall C1 of the cavity C is inclined, it is more conducive to the stress-release at the cavity wall C1 of the support layer 135 when bending.

It can be understood that the cavity wall C1 of the cavity C may also be curved or other shapes. It is not specifically limited in the present invention, as long as the orthographic projection of the opening of the cavity C on the substrate layer 131 covers the orthographic projection of the opening of the groove G on the substrate layer 131. In addition, the number of cavity C is not specifically limited. It may be one or multiple, as long as the positions of the cavity C and the groove G are in one-to-one correspondence.

In another embodiment of the present application, reference is made to FIG. 2 or FIG. 3. The substrate layer 131 is a multilayer structure including a first organic layer 1311, an inorganic layer 1312, and a second organic layer 1313, wherein the first organic layer 1311 is disposed on a side away from the metal wiring layer 132, the inorganic layer 1312 is disposed on the first organic layer 1311, and the second organic layer 1313 is disposed between the inorganic layer 1312 and the metal wiring layer 132.

The materials of the first organic layer 1311 and the second organic layer 1313 may be polymer materials such as polyimide, polycarbonate, polyethersulfone, polyethylene terephthalate, polyethylene naphthalate, polyarylates, glass fiber reinforced plastic, etc. For example, the materials of the first organic layer 1311 and the second organic layer 1313 are both polyimides. The material of the inorganic layer 1312 may be silicon oxide ($SiO_x$). The thicknesses of the first organic layer 1311, the inorganic layer 1312, and the second organic layer 1313 are not specifically limited and can be selected according to actual needs.

Wherein, the groove G is disposed on the side of the first organic layer 1311 away from the metal wiring layer 132, and the groove G is only formed in the first organic layer 1311 to let the metal wiring layer 132 be at or be close to a neutral layer of the film layer in the bending area.

Specifically, the ratio of the depth D of the groove G to the thickness of the first organic layer 1311 is ranged from 0.4:1 to 0.5:1, which is determined in this range according to specific process requirements in actual applications.

Figure 8:
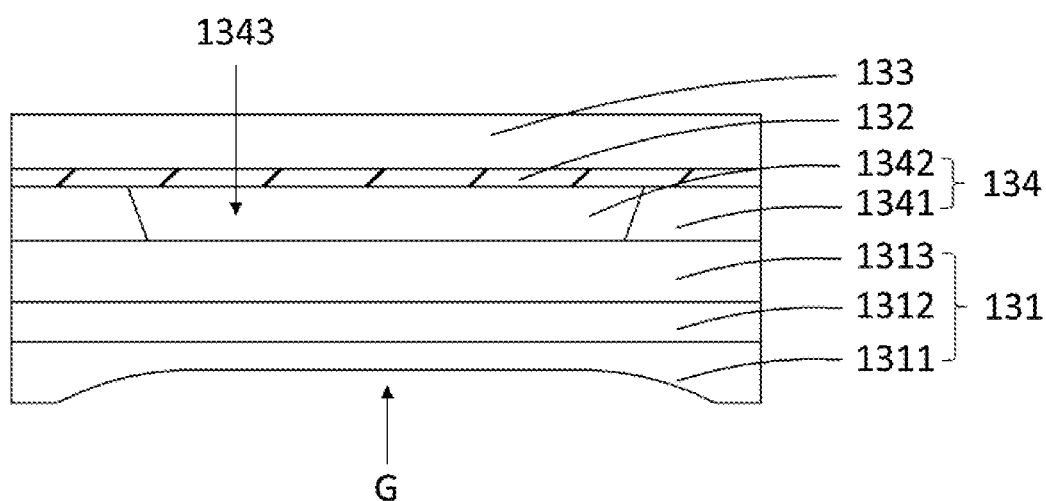
FIG. 8 is a schematic diagram of a cross-sectional structure of another display panel provided by an embodiment of the present invention.

In another embodiment of the present application, please refer to the cross-sectional structure shown in FIG. 8, the bending area further includes a second planarization layer 134 disposed between the substrate layer 131 and the metal wiring layer 132. The second planarization layer 134 includes an inorganic planarization layer 1341 and an organic planarization layer 1342, the inorganic planarization layer 1341 is provided with a through-hole 1343 at a position corresponding to the groove G. The organic planarization layer 1342 is disposed in the through-hole 1343 so that the top of the inorganic planarization layer 1341 and the top of the organic planarization layer 1342 are flush with each other, wherein the inorganic planarization layer 1341 is an inorganic film layer formed on the same layer as the gate insulating layer and the interlayer insulating layer in the display area of the display panel. However, because the stress of the inorganic film layer is relatively large, cracks may occur during bending. Therefore, the inorganic film layer is removed in the area to be bent to form a through-hole, and the through-hole is filled with an organic film layer with less stress, which is conducive to obtaining a higher bending yield and bending quality.

One of ordinarily skilled in the art can understand that the bending area may also include other layer structures according to the needs, which is not specifically limited here.

Figure 9:
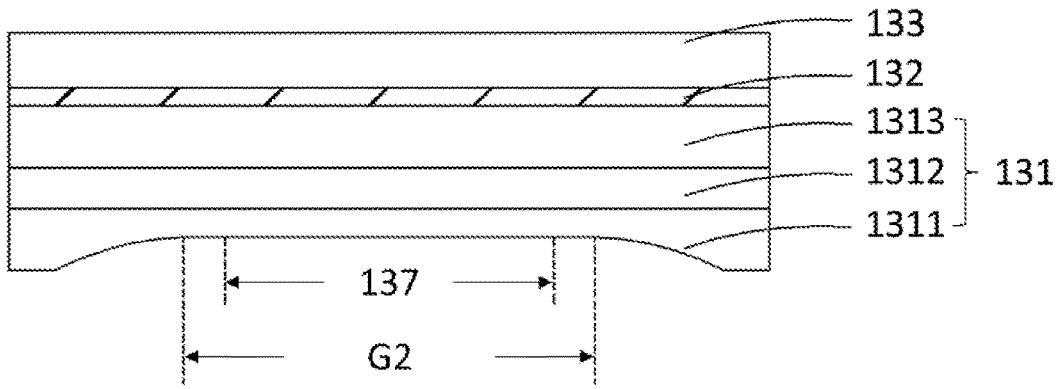
FIG. 9 is a schematic diagram of a cross-sectional structure of another display panel provided by an embodiment of the present invention.

In another embodiment of the present application, please refer to the schematic cross-sectional structure shown in FIG. 9. The bending area includes a bending portion 137, the bending portion 137 is disposed in the area corresponding to the groove bottom G2 of the groove G, and the bending portion 137 is bent to form the structure shown in FIG. 3. Wherein, the bending portion 137 is disposed to avoid the groove wall G1 of the groove G to effectively reduce the stress on the groove wall G1 of the groove G during bending, which is beneficial to obtain a higher bending yield and bending quality.

Figure 10:
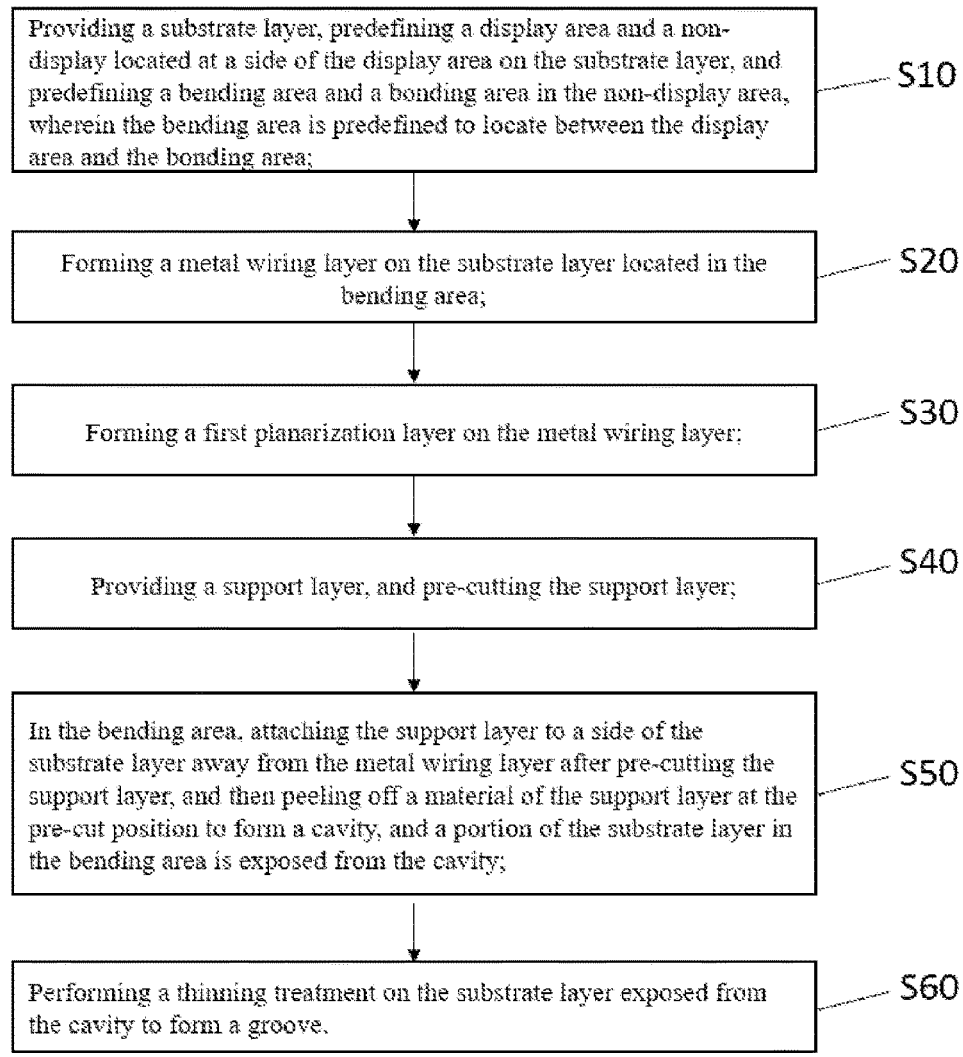
FIG. 10 is a flowchart of a manufacturing method of a display panel according to an embodiment of the present invention.

In another embodiment of the present application, a manufacturing method of a display panel is further provided. Hereinafter, a detailed description will be given with reference to the schematic flow chart of the manufacturing method provided in FIG. 10 and the structural schematic diagrams of the manufacturing method provided in FIG. 11a to FIG. 11f.

Figure 11A:
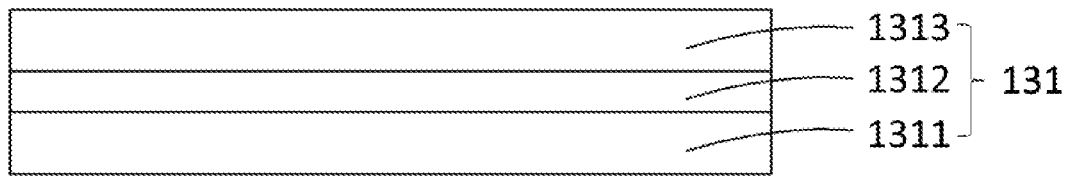
FIG. 11a to FIG. 11f are schematic diagrams of individual structures in processes of the method of manufacturing the display panel provided by an embodiment of the present invention.

Specifically, the manufacturing method includes following steps:

S10: providing a substrate layer 131, predefining a display area and a non-display area located at a side of the display area on the substrate layer 131, and predefining a bending area and a bonding area in the non-display area, the bending area is predefined to locate between the display area and the bonding area. Wherein, the substrate layer 131 may be a single-layer structure or a multi-layer structure. The substrate layer 131 includes a first organic layer 1311, an inorganic layer 1312, and a second organic layer 1313, which forms a structure as shown in FIG. 11a.

Figure 11B:
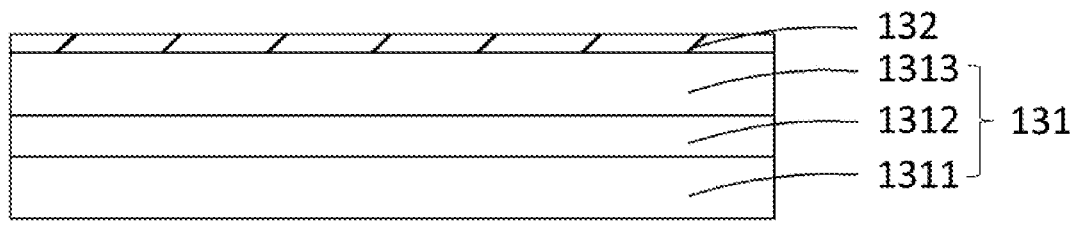

S20: forming the metal wiring layer 132 on the substrate layer 131 in the bending area, that is, forming the structure as shown in FIG. 11b.

Figure 11C:
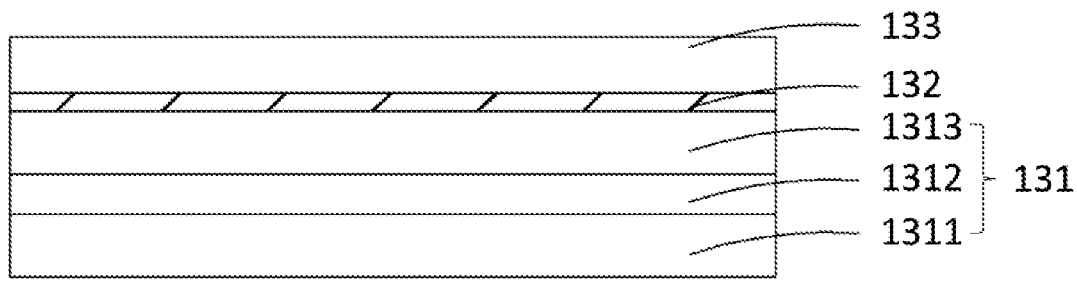

S30: forming the first planarization layer 133 on the metal wiring layer 132, that is, forming a structure as shown in FIG. 11c.

S40: providing a support layer 135, and pre-cutting the support layer 135 at a pre-cut position.

Figure 11D:
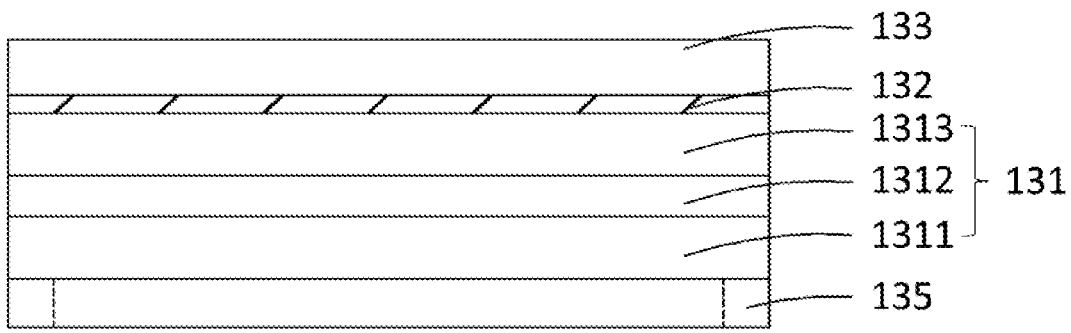
Figure 11E:
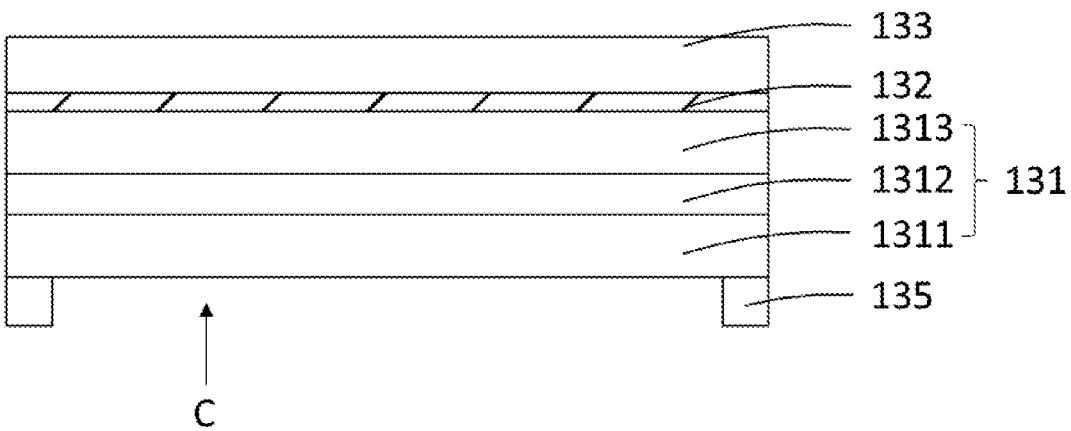

S50: attaching the pre-cutting support layer 135 to the substrate layer 131 in the bending area on the side away from the metal wiring layer 132 to form a structure as shown in FIG. 11d, and then peeling off the material of the support layer at the pre-cut position to form a cavity C, and a portion of the substrate layer 1311 in the bending area is exposed from the cavity C, that is, a structure as shown in FIG. 11e is formed.

Figure 11F:
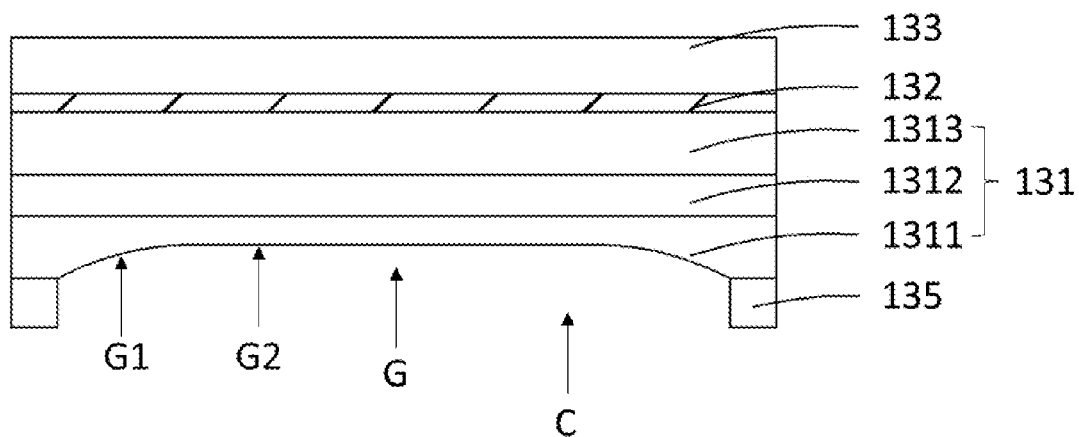

S60: performing a thinning treatment on the substrate layer 131 exposed from the cavity C to form a groove G, that is, to form a structure as shown in FIG. 11f.

Wherein, a groove wall G1 of the groove G extends along a curved surface or a flat surface to a groove bottom G2 of the groove G, and an orthographic projection of the groove bottom G2 of the groove G on the substrate layer 131 falls within an orthographic projection of an opening of the groove G on the substrate layer 131, an orthographic projection of an opening of the cavity C on the substrate layer 131 covers the orthographic projection of the opening of the groove on the substrate layer.

A display panel manufactured by the method provided in this embodiment is provided. On the one hand, by forming grooves on the surface of the substrate layer away from the metal wiring layer, the thickness of the substrate layer is effectively reduced, thereby adjusting the most stressed metal wiring layer in the film structure of the bending area to a neutral layer or close to a neutral layer. It can effectively release the bending stress of the metal wiring layer and greatly reduce the risk of metal wiring breakage. On the other hand, a special design is made for the shape of the groove wall of the groove, so that the stress at the groove wall of the groove changes slowly during bending, which reduces the risk of stress concentration and improves the quality of the substrate layer after bending. Therefore, by forming grooves of a specific shape on the substrate layer, the bending yield of the bending area of the display panel can be effectively improved, and a better bending effect can be ensured.

In another embodiment of the present application, in the step S60, the thinning process is to use a laser process to ablate the area that needs to be thinned to remove a part of the film layer to form the groove of a predetermined shape, wherein the wavelength of the laser ranges from 340 nanometers to 360 nanometers.

Figure 12:
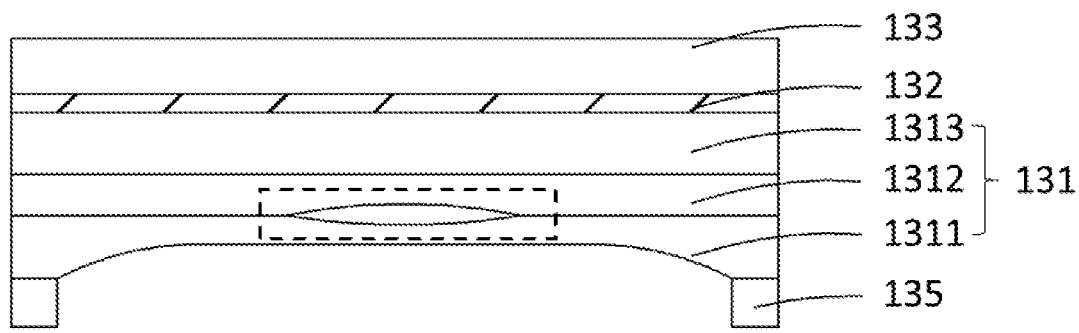
FIG. 12 is a schematic diagram of a poor structure caused by a manufacturing method of a display panel provided in the prior art.

The wavelength of the laser has a key influence on the shape of the groove. Especially when the substrate layer has a multilayer structure, it is required that the first organic layer 1311 has a higher absorption rate for the laser of the wavelength, while the inorganic layer 1312 has a lower absorption rate for the laser of the wavelength. That is, the laser of the specific wavelength has a higher selection ratio for the thinning speed of the first organic layer 1311 and the inorganic layer 1312, otherwise, the defects shown in FIG. 12 are likely to occur. The laser passes through the first organic layer 1311 to reach the inorganic layer 1312 and ablates part of the inorganic layer 1312, causing the interface between the first organic layer 1311 and the inorganic layer 1312 to peel off, resulting in poor bending.

In addition, the processing frequency of the laser is greater than or equal to 500 KHz, the scanning speed is greater than or equal to 800 mm/s, and the spot distance ranges from 2 microns to 10 microns.

The present invention has been described by the above-mentioned embodiments, but the above-mentioned embodiments are only examples for implementing the present invention. It should be noted that the disclosed embodiments do not limit the scope of the present invention. On the contrary, modifications and equivalent arrangements included in the spirit and scope of the claims are all included in the scope of the present invention.

What is claimed is:

1. A display panel, comprising a display area and a non-display area located at a side of the display area, wherein the non-display area comprises a bending area and a bonding area, the bending area is configured to be located between the display area and the bonding area, and the bending area comprises:
   a substrate layer;
   a metal wiring layer disposed on the substrate layer; and
   a first planarization layer disposed on the metal wiring layer;
wherein a groove is defined on a surface of the substrate layer away from the metal wiring layer, a groove wall of the groove extends along a curved surface or a flat surface to a groove bottom of the groove, and lets an orthographic projection of the groove bottom of the groove on the substrate layer fall within an orthographic projection of an opening of the groove on the substrate layer; wherein a ratio of a distance ΔW between a boundary of the orthographic projection of the opening of the groove on the substrate layer and a boundary of the orthographic projection of the groove bottom of the groove on the substrate layer to a depth D of the groove is greater than or equal to 10:1.

2. The display panel according to claim 1, wherein the distance ΔW is not less than 50 microns.

3. The display panel according to claim 1, wherein in a cross-section of the display panel, an angle θ between the groove wall of the groove and a horizontal direction is not greater than 6°.

4. The display panel according to claim 1, wherein the groove wall of the groove and the groove bottom of the groove is transitionally connected by a rounded corner.

5. The display panel according to claim 1, wherein the bending area further comprises a support layer, the support layer is disposed on a side of the substrate layer away from the metal wiring layer, the support layer is provided with a cavity at a position corresponding to the groove, and an orthographic projection of an opening of the cavity on the substrate layer covers the orthographic projection of the opening of the groove on the substrate layer.

6. The display panel according to claim 5, wherein a cavity wall of the cavity is an inclined plane inclined in a direction from inside of the groove to outside of the groove.

7. The display panel according to claim 5, wherein a cavity wall of the cavity is a flat surface perpendicular to the groove bottom of the groove.

8. The display panel according to claim 5, wherein a cavity wall of the cavity is a curved plane.

9. The display panel according to claim 1, wherein the substrate layer comprises a first organic layer, an inorganic layer, and a second organic layer that are stacked, the first organic layer is disposed on a side of the inorganic layer away from the metal wiring layer, and the groove is disposed on a side of the first organic layer away from the metal wiring layer.

10. The display panel according to claim 9, wherein a ratio of a depth D of the groove to a thickness of the first organic layer ranges from 0.4:1 to 0.5:1.

11. The display panel according to claim 1, wherein the bending area comprises a bending portion, and the bending portion is disposed in an area corresponding to the groove bottom of the groove.

12. The display panel according to claim 1, wherein the bending area further comprises a second planarization layer, and the second planarization layer is disposed between the substrate layer and the metal wiring layer.

13. The display panel according to claim 12, wherein the second planarization layer comprises an inorganic planarization layer and an organic planarization layer, the inorganic planarization layer is provided with a through-hole at a position corresponding to the groove, and the organic planarization layer is disposed in the through-hole.

14. A manufacturing method of a display panel, comprising following steps:
   providing a substrate layer, predefining a display area and a non-display area located at a side of the display area on the substrate layer, and predefining a bending area and a bonding area in the non-display area, wherein the bending area is predefined to locate between the display area and the bonding area;
   forming a metal wiring layer on the substrate layer located in the bending area;
   forming a first planarization layer on the metal wiring layer;

providing a support layer, and pre-cutting the support layer at a pre-cut position;

in the bending area, attaching the support layer to a side of the substrate layer away from the metal wiring layer after pre-cutting the support layer, and then peeling off a material of the support layer at the pre-cut position to form a cavity, and a portion of the substrate layer in the bending area is exposed from the cavity; and performing a thinning treatment on the substrate layer exposed from the cavity to form a groove;

wherein a groove wall of the groove extends along a curved surface or a flat surface to a groove bottom of the groove, and lets an orthographic projection of the groove bottom of the groove on the substrate layer fall within an orthographic projection of an opening of the groove on the substrate layer.

15. The manufacturing method of the display panel according to claim 14, wherein the thinning treatment is performed by a laser process, and a laser wavelength adopted in the laser process ranges from 340 nanometers to 360 nanometers.

16. A display panel, comprising a display area and a non-display area located at a side of the display area, wherein the non-display area comprises a bending area and a bonding area, the bending area is configured to be located between the display area and the bonding area, and the bending area comprises:

a substrate layer;

a metal wiring layer disposed on the substrate layer; and a first planarization layer disposed on the metal wiring layer;

wherein a groove is defined on a surface of the substrate layer away from the metal wiring layer, a groove wall of the groove extends along a curved surface or a flat surface to a groove bottom of the groove, and lets an orthographic projection of the groove bottom of the groove on the substrate layer fall within an orthographic projection of an opening of the groove on the substrate layer;

wherein the bending area further comprises a second planarization layer, and the second planarization layer is disposed between the substrate layer and the metal wiring layer.

17. The display panel according to claim 16, wherein the second planarization layer comprises an inorganic planarization layer and an organic planarization layer, the inorganic planarization layer is provided with a through-hole at a position corresponding to the groove, and the organic planarization layer is disposed in the through-hole.

18. The display panel according to claim 16, wherein the substrate layer comprises a first organic layer, an inorganic layer, and a second organic layer that are stacked, the first organic layer is disposed on a side of the inorganic layer away from the metal wiring layer, and the groove is disposed on a side of the first organic layer away from the metal wiring layer.

19. The display panel according to claim 18, wherein a ratio of a depth D of the groove to a thickness of the first organic layer ranges from 0.4:1 to 0.5:1.

20. The display panel according to claim 16, the bending area further comprises a support layer, the support layer is disposed on a side of the substrate layer away from the metal wiring layer, the support layer is provided with a cavity at a position corresponding to the groove, and an orthographic projection of an opening of the cavity on the substrate layer covers the orthographic projection of the opening of the groove on the substrate layer.

* * * * *